Figure 1:
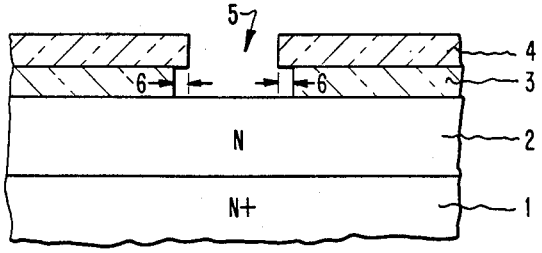
Figure 2:
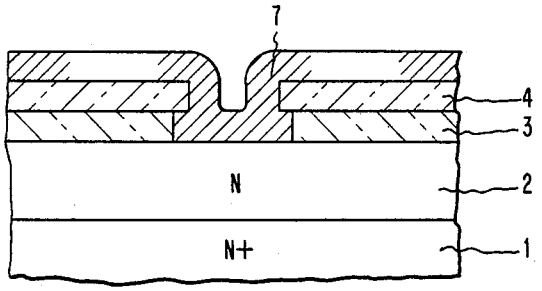
Figure 3:
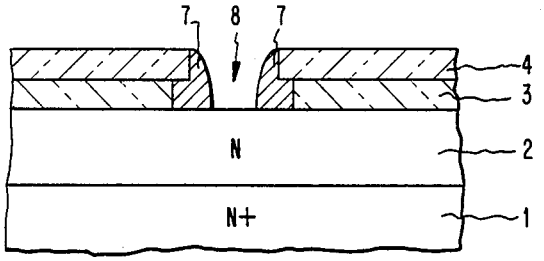
Figure 4:
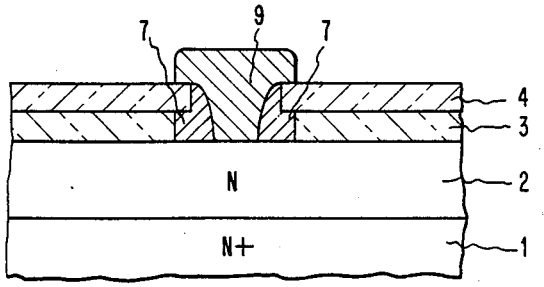

United States Defensive Publication [19] (H) [11] T101,201

Anantha et al. [43] Nov. 3, 1981

[54] METHOD FOR MAKING STABLE NITRIDE-DEFINED SCHOTTKY BARRIER DIODES

[76] Inventors: Narasipur G. Anantha, 1 Valdemar Rd., Hopewell Junction, N.Y. 12533; Harsaran S. Bhatia, 41 Tor Rd., Wappingers Falls, N.Y. 12590

[21] Appl. No.: 254,039

[22] Filed: Apr. 14, 1981

Related U.S. Application Data

[63] Continuation of Ser. No. 133,069, Mar. 24, 1980, abandoned.

[51] Int. Cl.[3] ..... H01L 21/308

[52] U.S. Cl. ..... 156/643; 156/653; 156/657; 156/662

[57] ABSTRACT

Excessive leakage after initial forward stress, exhibited by subsequently reverse stressed nitride defined, Schottky barrier diodes is solved by the elimination of the "mouse hole" or undercut cavity in the oxide layer beneath the nitride ring defining the Schottky contact to the underlying silicon. The aforementioned cavity is filled by depositing chemical vapor deposited (CVD) oxide onto the nitride layer, into the nitride ring and the undercut oxide cavity beneath the ring and onto the underlying silicon substrate exposed through the nitride ring. The CVD oxide is then reactively ion etched to remove it except along the vertical walls of the nitride ring and the oxide cavity. The Schottky metal is deposited on the silicon substrate exposed by the reactive ion etching step.

1 Claim, 1 Sheet Drawing,

9 Pages Specification

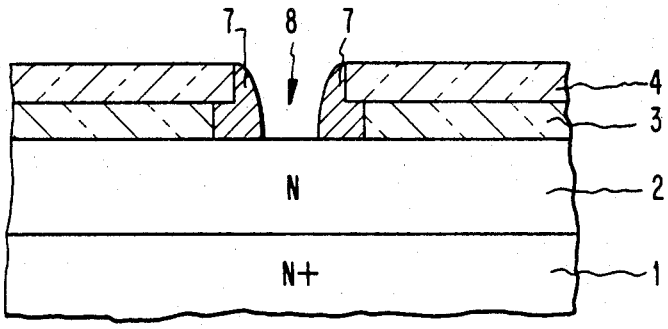

The file of this unexamined application may be inspected and copies thereof may be purchased (849 O.G. 1221, Apr. 9, 1968).